United States Patent [19]

Razeghi

[11] Patent Number: 5,421,910
[45] Date of Patent: Jun. 6, 1995

[54] INTERMETALLIC COMPOUND SEMICONDUCTOR THIN FILM

[75] Inventor: Manijeh Razeghi, Wilmette, Ill.

[73] Assignee: Northwestern University, Evanston, Ill.

[21] Appl. No.: 195,823

[22] Filed: Feb. 10, 1994

Related U.S. Application Data

[63] Continuation of Ser. No. 988,552, Dec. 10, 1992, abandoned.

[51] Int. Cl.$^6$ ............................................. H01L 29/12
[52] U.S. Cl. ..................................... 148/33.4; 437/133
[58] Field of Search .................... 148/33.4, DIG. 160; 437/107, 110, 133

[56] References Cited

U.S. PATENT DOCUMENTS

| | | |
|---|---|---|
| 3,364,084 | 1/1968 | Ruehrwein . |
| 4,207,122 | 6/1980 | Goodman ........................ 148/33.4 |
| 4,368,098 | 1/1983 | Manasevit . |
| 4,404,265 | 9/1983 | Manasevit . |
| 4,720,309 | 1/1988 | Deveaud et al. .................. 148/33.4 |
| 4,793,872 | 12/1988 | Meunier et al. .................. 148/33.4 |

OTHER PUBLICATIONS

"Photoexcited Escape Probability, Optical Gain, And Noise in Quantum Well Infrared Photodetectors;" by Levine, et al., *J. Appl. Phys.*, vol. 72, No. 9, Nov. 1, 1992 pp. 4429–4443.
"Gas Source Molecular-Beam Expitaxial Growth of Normal Incidence GaAs/AlGaAs Quantum Well Infrared Photodetectors;" by Kuo, et al., *J. Vac. Sci. Technol. B.*, vol. 10, No. 2, Mar./Apr. 1992 pp. 995–997.
"Growth of InSb on GaAs by Metalorganic Chemical Vapor Deposition;" by Biefeld, et al., *Journal of Crystal Growth*, (1991), vol. 109, pp. 272–278.
"High-Mobility InSb Grown by Organometallic Vapor Phase Epitaxy;" by Gaskill, et al., *Appl. Phys. Lett.*, vol. 58, No. 17, Apr. 29, 1991, pp. 1905–1907.
"Growth And Characterization of InAs/Ga$_{1-x}$In$_x$Sb Strained-Layer Superlattices;" by Chow, et al., *Appl. Phys. Lett.*, vol. 56, No. 15, Apr. 9, 1990, pp. 1418–1420.
"Organometallic Vapor Phase Epitaxial Growth And Characterization of InAsBi and A=InAsSbBi;" by Ma, et al., *Appl. Phys. Lett.*, vol. 55, No. 23, Dec. 4, 1989, pp. 2420–2422.
"Chapter 1–Growth Technology;" by M. Razeghi, *The MOCVD Challenge; vol. 1: A Survey of GaInAsP-InP for Photonic and Electronic Applications*; IOP Publishing Ltd., Philadlephia, Pa. (1989).
"High Photoconductive Gain in Lateral InAsSb Strained-Layer Sueprlattice Infrared Detectors;" by Kurtz, et al. *Appl. Phys. Lett.*, vol. 53, No. 20, Nov. 14, 1988, pp. 1961–1963.
*Hawley's Condensed Chemical Dictionary Twelfth Edition* revised by R. J. Lewis, Sr.; Van Nostrand Reinhold Co.; New York, N.Y. 1993, p. 38.
C.E.C. Wood, et al, "Thallium Incorporation in Molecular-Beam-Epitaxial InSb" *J. Appl. Phys.* 59 (10) 15 May 1986, pp. 3610–3612.

*Primary Examiner*—R. Bruce Breneman
*Assistant Examiner*—Linda J. Fleck
*Attorney, Agent, or Firm*—Welsh & Katz Ltd.

[57] ABSTRACT

An intermetallic compound semiconductor thin film comprises thin film made of the III-V group intermetallic compound InTlSb. Preferably, the thin film is grown by a vapor phase MOCVD method.

3 Claims, 1 Drawing Sheet

INTERMETALLIC COMPOUND SEMICONDUCTOR THIN FILM

Continuation of Ser. No. 988,552, Dec. 12, 1992 now abandoned.

The U.S. Government has rights in this invention pursuant to ONR Contract Number N00014-92-J-1951.

TECHNICAL FIELD

This invention relates to an intermetallic compound semiconductor thin film and a method of manufacturing the film, and more particularly to the III-V group intermetallic compound InTlSb thin film having both a high electron mobility and a low resistance value, and to a method of manufacturing a composite film of this and other III-V compounds.

At present, there are, in general, three material systems which are most used for long wavelength infrared detector (LWIR) applications. HgCdTe is the most common material used in intrinsic LWIR detector applications. However, there are many material problems which limit this material to be the best IR detector. The weak Hg-Te bonding restrict the strength of the material and causes problems in material processing. The high vapor pressure of Hg leads to the difficulty matter of growing a highly uniform composition over a large area. The self compensation mechanism of HgTe makes high levels of doping difficult. This high Hg diffusion coefficient decreases the stability of the devices. HgCdTe is difficult to grow on Si and GaAs, two of the more common substrates, which makes it a less ideal material for Focal Plane Arrays application.

Ge:Hg is another material for extrinsic LWIR application. This material system has two major problems-it requires low temperature operation (30K) and the indirect band gap of Ge restricts the speed of response.

GaAs/AlGaAs quantum well infrared detector has recently been realized by using the transitions between the subbands in the GaAs well. The best result obtained in this structure is the detection on $10^{10}$ cm Hz$^{\frac{1}{2}}$W$^{-1}$ at an operating temperature of 68K in a detector with a cut-off wavelength of 10.7 $\mu$m. Although these structures show some promise, they are currently expensive to produce and are unstable against interdiffusion at higher temperatures.

Another material system which has recently been investigated extensively for infrared detector application is InSb. The bandgap of this material is 0.17 eV at 300K. In order to have material in the long wavelength region, InTlSb has been considered. Nonequilibrium growth technique such as MOCVD can overcome the phase segregation problem. TlSb alloy shows itself to be an ideal candidate to replace HgCdTe.

Metallorganic chemical vapor deposition (MOCVD) has established itself as a unique and important epitaxial crystal growth technique yielding high-quality low-dimensional structures for semiconductor devices, both electronic and photonic. The growth of semiconductor III-V compounds by MOCVD involves introducing metered amounts of the group III alkyls and the group V hydrides into a quartz tube that contains a substrate placed on radiofrequency heated carbon susceptor. The hot susceptor has a catalytic effect on the decomposition of the gaseous products and the growth therefore takes place primarily at this hot substrate. MOCVD is attractive because of its relative simplicity compared to other growth methods. It can produce heterostructures, multiquantum wells, and superlattices with very abrupt switch-on switch-off transitions in composition as well as in doping profiles in continuous growth by rapid changes of the gas composition in the reaction chamber.

The technique is attractive in its ability to grow uniform layers, its low background doping density and sharp interfaces, and in the potential for commercial applications. MOCVD can prepare multilayer structures with thickness as thin as a few atomic layers.

SUMMARY OF THE INVENTION

Therefore, an object of the subject invention is a semi-metallic III-V alloy of the formula InTlSb for use in a film for long wavelength infrared detector and a method for making such a film.

A further object of the subject invention is a method for making a III-V alloy of the formula InTlSb.

A further object of the subject invention is a hetero and other multiple layer films alternating a layer of InSb with a layer of InTlSb.

The above objects are attained by growing InSb films by MOCVD or other known method on a suitable substrate such as InSb, InP, InAs, or GaAs. Triethylindium and trimethylantimony are used as sources for In and Sb, respectively. Growth conditions such as substrate temperature, flow rates, and orientation of the substrates are monitored to obtain high quality InSb films.

Next, an InTlSb film is grown. For frequencies in the 8-12 $\mu$m region, the optimum composition is $In_{0.95}Tl_{0.05}Sb$. Thus, only very little Tl needs to be incorporated into InSb lattice. Tl sources may take the form of cyclopentadienyl thallium (CpTl).

When forming the films of the subject invention by MOCVD, the sources generate a vapor which is carried by $H_2$ gas to the heated substrate where it is deposited as $In_{1-x}Tl_xSb$, or as InSb, dependent on the layer being grown.

These and other objects and features of the invention will be better appreciated by reference to the following description of the various embodiments made in conjunction with the accompanying drawings wherein, FIG. 1 is a schematic showing an MOCVD reactor for use in the subject invention.

DETAILED DESCRIPTION OF THE INVENTION

Figure 1:
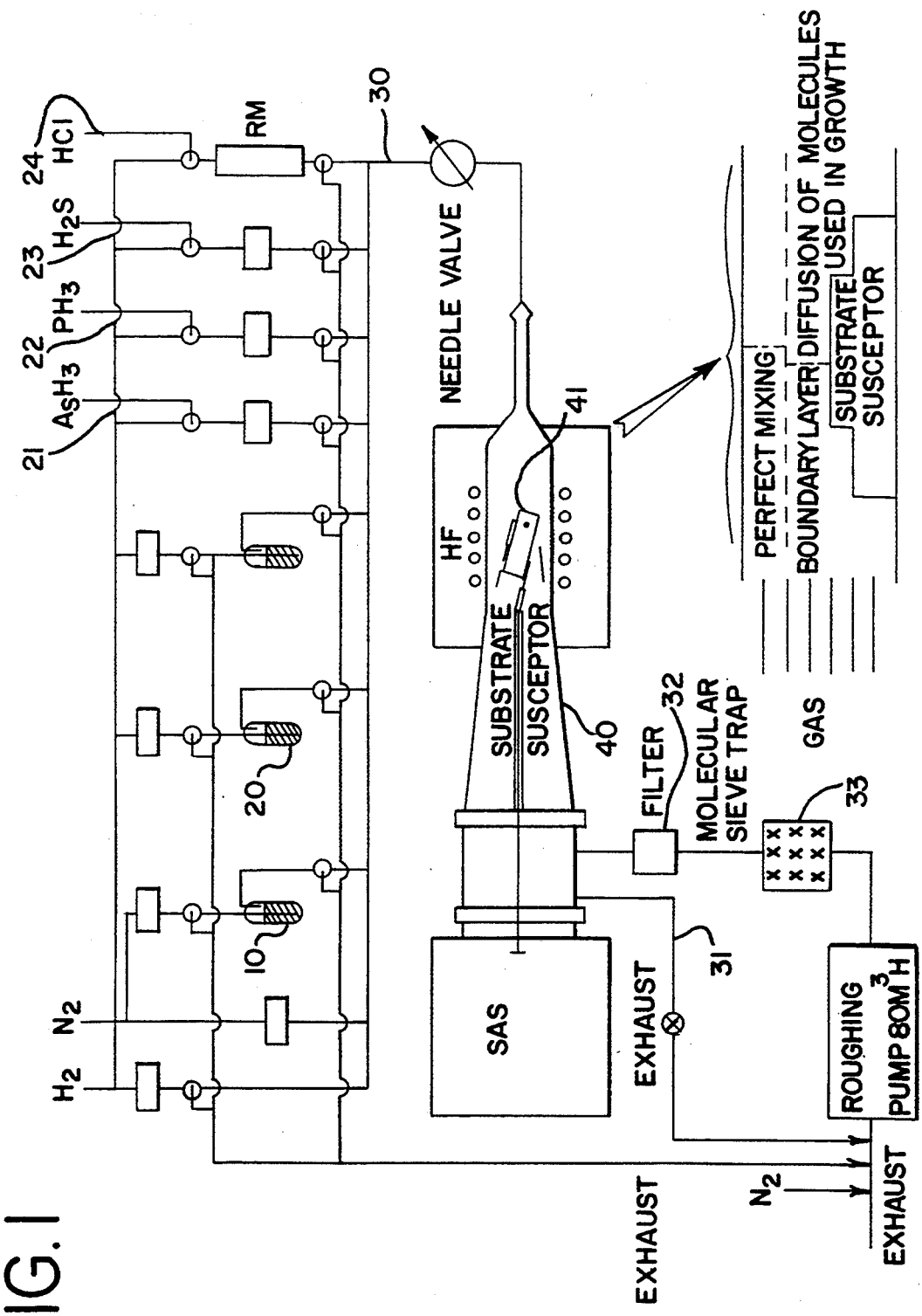

For detectors in the wavelength range of 8-12 $\mu$m, the InTlSb alloy can result in a decreased bandgap in the 8-10 $\mu$m wavelength range. These properties are attractive for infrared detectors because it is expected that InTlSb should have miscibility in all compositions so that the bandgap can be varied widely. Also, the lattice constant of InTlSb is generally the same as that of InSb which is an advantage for growing lattices with matched heterostructures.

When growing InTlSb by MOCVD, all ingredients and operating conditions are maintained very clean and purity is absolutely necessary. Cyclopentadienyl thallium (CpTl) is preferably used as a source for Tl. CpTl is available from Morton International, Advanced Materials, CVD Metal Organics, Danvers, Mass. CpTl is a solid at room temperature and has very low vapor pressure ($10^{-1}$ torr). Growth conditions were maintained the same for InTlSb and InSb. Superclean semi-insulating GaAs (100) and InSb (100) were used as substrates. As a first step, InSb layer was grown on both substrates.

Referring to FIG. 1, pure $H_2$ (99.9999%) is bubbled through solution 10 containing the precursor Indium source, such as trimethyl indium or triethyl indium which is maintained at 0°-18° C., preferably 18° C. at 1.5 l/min. The H$_2$ gas flow containing the dilute vapor solution of the indium precursor is transported at or near room temperature to the hot substrate 41. H$_2$ is also bubbled through the Sb source 20, i.e., a liquid solution of the precursor trimethylantimony or triethylantimony. The dilute vapor solution of the antimony precursor is transported through line 30 to the substrate chamber 40 where substrate 41 is mounted. Substrate 41 may be InP, GaSb, InAs, GaAs, CdTe, Si, or InSb as known in the art. The temperature of substrate 41 may be kept from 400° C. to 550° C., and preferably at 480° C. for purposes of this invention. The pressure throughout the growth procedure of the substrate chamber is maintained at low pressures of 50-100 torr, preferably at 76 torr. Unreacted gas and vapor are exhausted through line 31, or through filter 32 to molecular sieve trap 33 to exhaust. The In and Sb precursor vapors are transported to the substrate for a given period of time to achieve a desired thickness, which may range from 10 Å to the desired thickness of 2-3 μm, or higher. Generally, maintenance of the flow of the precursors for 1 hour is sufficient to reach the desired thickness of 2-3 μm.

After the first layer of InSb is grown, a layer of InTlSb is grown by bubbling H$_2$ through both the In precursor and the Sb precursor as above, as well as through a liquid solution 50 of a thallium precursor at 18° C. Suitable thallium precursors are the preferred CpTl, pentamethylcyclopentadienyl thallium (Me$_5$CpTl), methylcyclopentadienyl thallium (MeCpTl), isopropylcyclopentadienyl thallium (i-C$_3$H$_7$CpTl), t-butylcyclopentadienyl thallium (t-C$_4$H$_9$CpTl), and trimethyl thallium (Me$_3$Tl). All three precursor vapors are transported at room temperature to the heated substrate where InTlSb is grown as a second layer. This process is repeated as many times as necessary with alternating layers of InTlSb and InSb until the desired number of layers is reached.

Should doping be required, inlets 21-24 may be used to permit the entry of gases such as disilane for n-type doping or dimethyl cadmium or dimethyl zinc for p-type doping. Pure H$_2$ or N$_2$ may be used as a carrier gas.

EXAMPLE 1

Using the reactor of FIG. 1, InSb is deposited on a substrate of InSb by bubbling pure H$_2$ through liquid solutions of the precursors triethylindium and tetraethylantimony at a flow rate of 1.5 l/min. Both precursor solutions are maintained at 18° C. The H$_2$ carries the precursor vapors to the substrate which is maintained at 480° C. InSb is thus grown on the substrate for an hour. A layer of InTlSb is next grown on top of the InSb layer by initiating a flow of Tl precursor by bubbling pure H$_2$ through a solution of CpTl maintained at 18° C. to generate a Tl precursor vapor flow simultaneously with the In and Sb precursor vapor flows generated as set forth above. The layer of InTlSb is thus grown for 1 hour. Mobility of the resultant films are set forth in Table I.

EXAMPLES 2-6

The procedure set forth in Example 1 was followed, with exception of the variation of the source temperatures of the precursors and the growth time.

TABLE I

| EXP NO | SOURCE TEMP °C. (In) | SOURCE TEMP °C. (Tl) | InSb Layer | | | InTlSb Layer | | | | Mobility 85K cm$^2$V$^{-1}$s$^{-1}$ | Mobility 85K cm$^2$V$^{-1}$s$^{-1}$ | Carrier Conc. Book cm$^{-3}$ |
|---|---|---|---|---|---|---|---|---|---|---|---|---|
| | | | Sb | In | Time | Sb | In | Tl | Time | | | |
| 1 | 18 | 18 | 200 | 100 | 1 hr | 200 | 100 | 100 | 1 hr | 25300 | 31900 | 3.62 10$^{16}$ |
| 2 | 18 | 25 | 200 | 100 | 1 hr | 200 | 50 | 100 | .5 hr | 585 | 26000 | 3.5 10$^{16}$ |
| 3 | 18 | 60 | 200 | 50 | 1 hr | 200 | 25 | 150 | 2 hr | 6350 | 6310 | 1.54 10$^{18}$ |
| 4 | 18 | 60 | — | — | — | 200 | 50 | 150 | 2 hr | 6570 | 21200 | 1.83 10$^{16}$ |
| 5 | 16 | 18 | 200 | 100 | 1 hr | 200 | 100 | 20 | 1 hr | — | 21700 | 2.72 10$^{16}$ |
| 6 | 18 | 18 | 200 | 50 | 1 hr | 200 | 50 | 20 | 1.5 hr | — | 14400 | 4.84 10$^{16}$ |

By the above examples, the electron hall mobilities of the resultant films shows optimum results at 18° C. source temperature and one hour growths, with high mobilities and low carrier concentrations under such conditions.

The Hall mobility results set forth in Table I indicates that the InSb/InTlSb heterostructure of the subject invention is Type I and that the In$_{1-x}$Tl$_x$Sb layers are the quantum wells for both electrons and holes. In addition, to the preparation of the subject films by vapor phase MOCVD, it is also contemplated that liquid phase MOCVD, molecular beam epitaxy (MBE), vapor phase epitaxy (VPE) and liquid phase epitaxy (LPE) procedures may be used to prepare the composite films of the subject invention.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed:

1. A composite film for use in semiconductors, said film being selected from the group consisting of heterostructures, double heterostructures, quantum wells, multiquantum wells, and superlattices, said film comprising alternating layers of InSb and InTlSb on a substrate. wherein the InTlSb has a decreased bandgap in the 8-10 μm wavelength range.

2. The composite film of claim 1 wherein said layers are from about 10 Å to about 3 μm.

3. A composite film for use in semiconductors, said film being selected from the group consisting of heterostructures, double heterostructures, quantum wells, multiquantum wells, and superlattices, said film comprising MOCVD Grown alternating layers of the alloy InSb and the alloy InTlSb on a substrate selected from the group consisting of InSb, Si, GaAs, CdTe, InP, GaSb, and InAs, wherein the alloy InTlSb has a decreased bandgap in the 8-10 μm range.

* * * * *